United States Patent [19]

Kameda

[11] Patent Number: 4,814,840
[45] Date of Patent: Mar. 21, 1989

[54] HIGH-DENSITY REPROGRAMMABLE SEMICONDUCTOR MEMORY DEVICE

[76] Inventor: Masahiro Kameda, 7-1-4, Minami-kasugaoka, Ibaragi-shi, Osaka-fu, Japan

[21] Appl. No.: 893,941

[22] Filed: Aug. 6, 1986

[30] Foreign Application Priority Data

Aug. 9, 1985 [JP] Japan .................. 60-176589

[51] Int. Cl.$^4$ .......................................... H01L 29/78
[52] U.S. Cl. ................................ 357/23.5; 357/55; 365/185
[58] Field of Search .................. 357/23.5, 23.6, 54, 357/54 M, 55, 41, 59 G; 365/185

[56] References Cited

U.S. PATENT DOCUMENTS 4,713,677 12/1987 Tigelaar .................. 357/23.5
4,763,177 8/1988 Paterson .................. 357/23.5

FOREIGN PATENT DOCUMENTS 59-61188 4/1984 Japan .................. 357/23.5

OTHER PUBLICATIONS

IBM Technical Disclosure Bulletin, vol. 24, #3, pp. 1331-1333, by Tsang.

Primary Examiner—Martin H. Edlow
Assistant Examiner—Mark Prenty

[57] ABSTRACT

A process for manufacturing a reprogrammable semiconductor memory device, such as EPROM, and its resulting structure is provided. A substrate has a main surface which is provided with grooves formed by etching. An oxide film is formed on the main surface and the side and bottom surfaces of each of the grooves. And, a first layer of doped polysilicon is formed on the oxide film, and the first layer of doped polysilicon is disconnected at the bottom of each of the grooves by selective removal thereof. A second layer of doped polysilicon is formed on the first layer of doped polysilicon with an inter-layer electrical insulator sandwiched therebetween. Thus, the first and second layers of polysilicon, together with the inter-layer insulator, define a stacked-gate electrode structure. A pair of source and drain regions is formed in the substrate one on each side of the stacked-gate electrode structure. The electrode structure is partly formed in the grooves, which allows to save space occupied by a memory cell in a horizontal plane and thus allows to make a memory cell compact in size.

3 Claims, 3 Drawing Sheets

FIG.Id
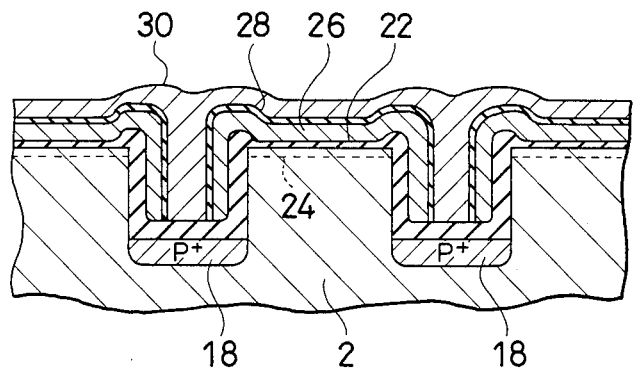
FIG.Ie
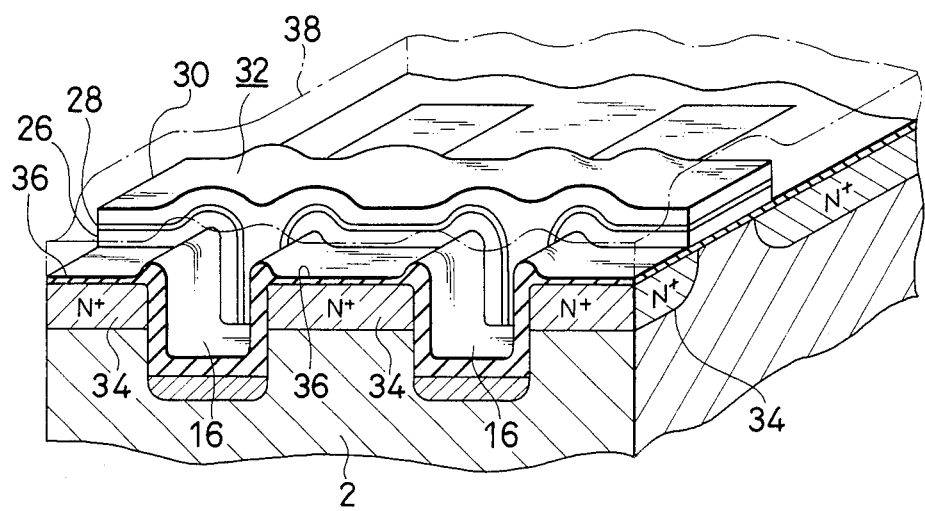

HIGH-DENSITY REPROGRAMMABLE SEMICONDUCTOR MEMORY DEVICE

BACKGROUND OF THE INVENTION

1. Field of the Invention

This invention relates to a MOS type semiconductor memory device, and, in particular, to a reprogrammable semiconductor memory device, such as an EPROM or EEPROM.

2. Description of the Prior Art

A reprogrammable semiconductor memory device, such as an electrically programmable read only memory or simply EPROM, is well known in the art. A typical prior art EPROM is shown in FIGS. 3a and 3b in plan and cross sectional views, respectively. An EPROM typically has a two-layer polysilicon structure and the illustrated EPROM includes a silicon substrate 2, a gate oxide 4 formed on the silicon substrate 2, a floating gate 6 formed by a first layer of polysilicon, an interlayer oxide film 8, and a control gate 10 formed by a second layer of polysilicon. Also provided in the structure shown in FIG. 3b is a field oxide 12 formed for example by the LOCOS (local oxidation of silicon) method. Also defined in the silicon substrate 2 as shown in FIG. 3a - is a source region S and a drain region D.

In such an EPROM, a capacitance $C_2$ between the control gate 10 and the floating gate 6 is generally required to be approximately three times larger than a capacitance $C_1$ between the floating gate 6 and the channel region of the substrate 2. For this reason, the floating gate 6 is typically formed to significantly extend over the field oxide 12. As an example, assuming that the structure shown in FIG. 3a has a channel region whose width W is 2 microns and length L is 3 microns, the area required for the floating gate 6 to extend over the field oxide 12 will be 2 microns $\times$ 3 microns at each side of the channel region As a result, the area occupied by a single memory region indicated by the one-dotted line M will be 2 microns $\times$ 12 microns, which is rather large. The above arguments also hold true for an electrically erasable PROM or EEPROM. As set forth above, since the floating gate 6 extends horizontally over the field oxide significantly, there has been a difficulty in making a reprogrammable memory device compact in size or high in density.

SUMMARY OF THE INVENTION

In accordance with the present invention, there is provided a method for manufacturing a reprogrammable semiconductor memory device and its resulting structure. In accordance with the present invention, a main surface of a substrate is selectively etched to form at least two grooves spaced apart from each other over a predetermined distance. A gate oxide is formed on the main surface of the substrate as located between the two grooves. And, a first layer of polysilicon to be defined into a floating gate is formed on the gate oxide and extending into each of the grooves. Similarly, an interlayer insulating film is formed on the first layer of polysilicon and a second layer of polysilicon to be defined into a control gate is then formed on the interlayer insulating film. With this structure, the stacked-gate structure is formed three dimensionally with the provision of grooves in the main surface of the substrate, the two-dimensional area occupied by a single memory element is minimized, thereby allowing to provide a high-density memory device, or, alternatively, a memory device reduced in size.

It is therefore a primary object of the present invention to obviate the disadvantages of the prior art as described above and to provide an improved semiconductor memory device.

Another object of the present invention is to provide a method for manufacturing a reprogrammable semiconductor memory device and its resulting structure.

A further object of the present invention is to provide a reprogrammable semiconductor device having a reduced memory size or alternatively an increased memory density.

Other objects, advantages and novel features of the present invention will become apparent from the following detailed description of the invention when considered in conjunction with the accompanying drawings.

BRIEF DESCRIPTION OF THE DRAWINGS

FIGS. 1a through 1e are schematic illustrations showing a sequence of steps in manufacturing an EPROM in accordance with one embodiment of the present invention;

DESCRIPTION OF THE PREFERRED EMBODIMENTS

Figure 1A:
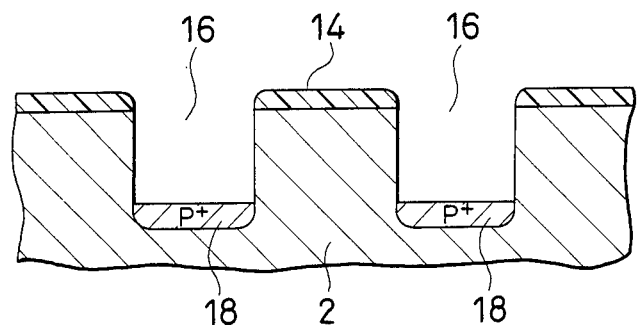

Referring now to Figs. 1a through 1e, a process for manufacturing an EPROM in accordance with one embodiment of the present invention will be described. First, as shown in FIG. 1a, a resist pattern 14 is formed on a top surface of a silicon substrate 2 and, then, using this resist pattern 14 as a mask, the top surface of the silicon substrate 2 is selectively etched, thereby forming grooves 16. The etching in this step can be carried out for example under the following conditions.

Etching Apparatus: Parallel Plate Type Plasma Etcher (e.g., OAPM-400 available from Tokyo Ohka Kogyo, Kanagawa, Japan)

Etching gas: Mixture gas of $C_2ClF_5$:$SF_6$=2:1 at the total flow rate of 40–50 cc/min. at the pressure of 0.4 Torr.

Frequency: 13.56 MHz

Power: 150 W

Etch rate: approximately 1 microns/min.

After the etching step as described above, boron ions (B+) are implanted into the substrate 2 at the bottom of each of the grooves 16 at the energy of 50 KeV and dose of $5 \times 10^{13}$ ions/cm$^2$, thereby forming an ion implanted region 18, serving as a channel stop, at the bottom of each of the grooves 16.

Then, after removing the resist layer 14, the top surface, including the surface of each of the grooves 16, is oxidized to form an oxide film. This oxidation is for example carried out in the atmosphere of $H_2$:$O_2$ = 1:2 at the temperature of 950° C for 2.5 hours. Thus, there results a film of silicon oxide at the top surface of the substrate 2, whose thickness is approximately 5,000 angstroms.

Figure 1B:
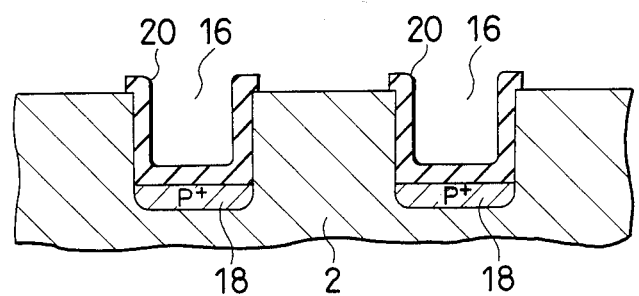

Then, as shown in FIG. 1b, a well-known photolithographic technique is applied to remove the oxide film from the substrate 2 excepting that portion of the oxide film 20 which is formed on the side and bottom walls of each of the grooves 16.

Figure 1C:
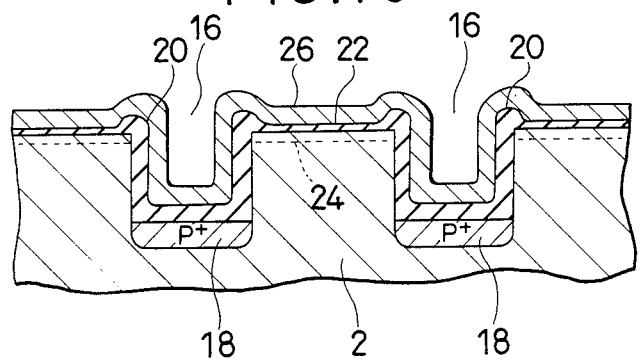
Figure 2:
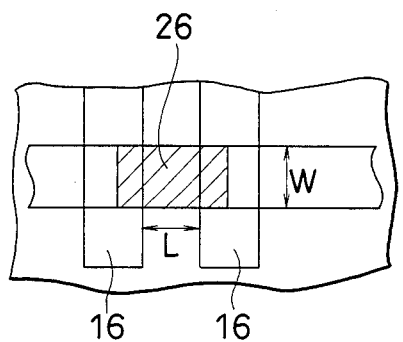
FIG. 2 is a schematic illustration showing in plan view the EPROM constructed in accordance with the process shown in Figs. 1a through 1e.

Then, as shown in FIG. 1c, the top surface of the substrate 2 is again subjected to oxidation to form, in particular, a gate oxide 22 on the top surface of the substrate 2 between the two associated grooves 16, 16. The oxidation in this step for forming the gate oxide 22 is carried out in a dry oxygen atmosphere at the temperature of 1,050° C, so that the gate oxide film 22 of approximately 500 angstroms is formed. Thereafter, boron ions are implanted at the energy of 60 KeV and the dose of $2 \times 10^{11}$ ions/cm$^2$, thereby forming a channel doped region 24. Then, a first polysilicon layer 26 is grown at the total exposed surface of the substrate 2. This first polysilicon layer 26 is later formed into a floating gate. Such a first polysilicon layer 26 may be formed, for example, by causing silane to be decomposed at the temperature of 635° C using the low pressure chemical vapor deposition method. Then, phosphorus is introduced into the first polysilicon layer 26 to reduce the sheet resistance of the first polysilicon layer 26 to 30-50 ohms/square.

Then, as shown in FIG. 1d, using a well-known photolithographic method, the first layer 26 of polysilicon is partly removed and disconnected at the bottom wall of each of the grooves 16. Thereafter, using the wet oxidation method at the temperature of 950° C, an oxide film 28 serving as an inter-layer insulation film is formed on the exposed surface of the first polysilicon layer 26 to the thickness of approximately 950 angstroms. And, then, a second polysilicon layer 30 to be formed into a control gate is formed on the inter-layer insulation film 28. Thereafter, phosphorus is introduced into the second polysilicon layer 30 thereby setting its sheet resistance in the order of 20 ohms/square.

Then, a resist pattern is formed at the top surface of the structure, and using this resist pattern as a mask, the first polysilicon layer 26, inter-layer insulation film 28 and second polysilicon layer 30 are selectively etched away, thereby defining a gate electrode 32, as shown in FIG. 1e. In the region where the gate electrode 32 is formed, the second polysilicon layer 30 extends right to left as viewing into FIG. 1e and it also plugs each of the grooves 16 in that region in the illustrated embodiment. Thereafter, the oxide film 22, a part of which is defined as a gate oxide, is selectively etched away at those portions which correspond to to-be-formed source and drain regions. Then, arsenic ions (As+) are introduced by ion implantation at the energy of 60 KeV and dose of $5 \times 10^{14}$ ions/cm$^2$. The structure is then heated in a nitrogen containing atmosphere at the temperature of 1,000° C for 15 minutes to drive-in the implanted arsenic ions, thereby defining source and drain diffusion regions 34.

Thereafter, the oxidation step is carried out in an atmosphere of $H_2O:O_2 = 1:2$ at the temperature of 950° C for 15 minutes to form an oxide film 36 having the thickness of approximately 800 angstroms. Then, according to a method well known in the art, such as low pressure CVD method, a layer 38 of phosphosilicate glass (PSG), containing 8 mole % of phosphorus, is formed on the top surface of the structure to the thickness of approximately 12,000 angstroms as a protection layer. It is to be noted that this PSG layer 38 completely plugs the space defined by each of the grooves 16 in the illustrated embodiment. The remaining steps are also well known for those skilled in the art. For example, the PSG layer 38 is densified for subjecting the structure to an atmosphere of $H_2:O_2 = 1:1$ at the temperature of 1,050° C for an hour, which is followed by the steps of forming contact holes, metallization of interconnection pattern, and formation of pads.

As an alternative, instead of using polysilicon, the control gate 30 may be formed from other well-known gate electrode forming materials, such as MoSi$_2$. In addition, instead of using PSG glass, use may also be made of borosilicate glass or the like as a material for forming the protective layer 38.

Figure 3A:
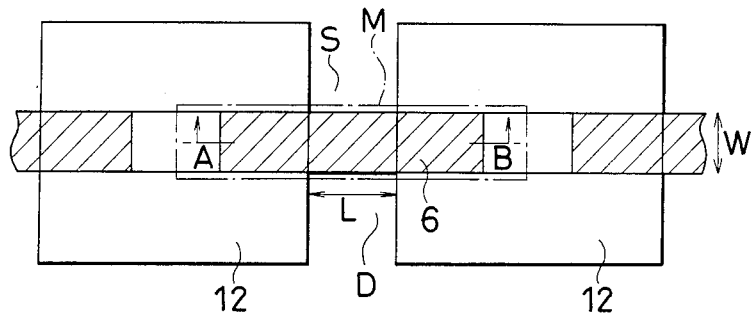
FIGS. 3a and 3b are schematic illustrations showing a typical prior art EPROM in plan view and cross sectional view, respectively.
Figure 3B:
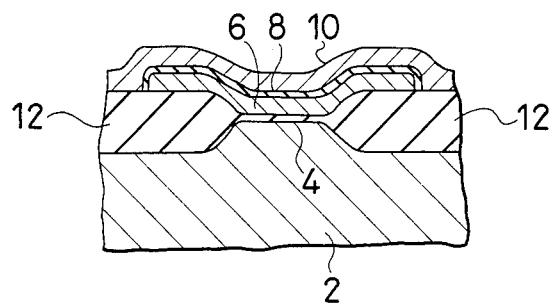

As described above in detail, in accordance with the present invention, those portions of the floating gate 26 which extend outside of the channel region defined by L (length)$\times$W (width) are formed inside of the associated grooves 16 as extending substantially vertically, so that the area occupied by a single memory element in a horizontal plane is reduced by that amount corresponding to the extended portions. On the other hand, if device isolation is carried out by the so-called LOCOS method as in the prior art, the drawn size must be set at 3 microns because of the occurrence of the so-called bird's beak if an effective channel length of 2 microns is desired. However, in accordance with the present invention, since device isolation does not rely on the LOCOS method, and, instead, grooves provided in the main surface are relied on for device isolation, there is no need to provide a margin for the bird's beak and the drawn size may be set at 2 microns even if an effective channel length of 2 microns is desired. As a result, in the case where an effective channel of 2 microns in width and 2 microns in length is desired, the size of a memory cell according to the prior art EPROM of FIG. 3 is approximately 2 microns$\times$12 microns; on the other hand, the size of a memory cell according to the present invention will be approximately 2 microns$\times$3 microns, which indicates that the present invention allows to make a memory cell which is approximately a quarter in area of the prior art memory cell.

While the above provides a full and complete disclosure of the preferred embodiments of the present invention, various modifications, alternate constructions and equivalents may be employed without departing from the true spirit and scope of the invention. Therefore, the above description and illustration should not be construed as limiting the scope of the invention, which is defined by the appended claims.

What is claimed is:

1. A semiconductor device comprising:
   a semiconductor substrate having a main surface which is provided with at least one groove which extends in a selected direction, has a side surface and a bottom surface, and has a device isolation function;
   a first electrically insulating film formed on said main surface of the substrate as well as on said side and bottom surfaces of said groove, said first electrically insulating film having a predetermined thickness at a selected flat portion of said main surface;
   a first layer of doped polysilicon having a predetermined width and extending on said first electrically insulating film across said selected flat region of said substrate and also continuously into said groove along said side surface of said groove;
   a second electrically insulating film having said predetermined width and formed on said first layer of doped polysilicon, said second electrically insulating film merging into said first electrically insulating film within said groove to thereby terminate an extension of said first layer of doped polysilicon within said groove;

a second layer of doped polysilicon having said predetermined width and formed on said second electrically insulating film; and a channel region formed in said substrate underneath said selected flat region of said substrate, and a pair of diffusion regions formed in said substrate on both sides of said selected flat region, spaced apart from each other by said channel region along said selected direction in which the groove extends.

2. The device of claim 1 including a groove formed in said substrate at each of opposite ends of said selected region.

3. A semiconductor device as in claim 1 in which said second layer of polysilicon extends to and contacts the first electrically insulating film at the bottom of said groove.